United States Patent
Savkar

[11] Patent Number: 5,356,474
[45] Date of Patent: Oct. 18, 1994

[54] APPARATUS AND METHOD FOR MAKING ALIGNED HI-TC TAPE SUPERCONDUCTORS

[75] Inventor: Sudhir D. Savkar, Schenectady, N.Y.

[73] Assignee: General Electric Company, Schenectady, N.Y.

[21] Appl. No.: 982,526

[22] Filed: Nov. 27, 1992

[51] Int. Cl.$^5$ ............................................. C23C 16/00
[52] U.S. Cl. ................................... 118/719; 118/715; 118/722; 118/724; 118/718; 505/950; 505/410; 505/473
[58] Field of Search ............... 118/715, 719, 724, 718, 118/722; 505/1

[56] References Cited

U.S. PATENT DOCUMENTS

| | | | |
|---|---|---|---|
| 4,507,189 | 3/1985 | Doi et al. | 204/192 N |
| 4,663,826 | 5/1987 | Baeuerle | 29/571 |
| 4,701,592 | 10/1987 | Cheung | 219/121 LE |
| 4,897,378 | 1/1990 | Chiang | 505/1 |
| 4,908,346 | 3/1990 | Strom et al. | 505/1 |
| 4,916,114 | 4/1990 | Hoenig | 505/1 |
| 4,921,833 | 5/1990 | Takano | 505/1 |
| 4,940,693 | 7/1990 | Shappirio et al. | 505/1 |
| 4,959,346 | 9/1990 | Mogro-Campero et al. | 505/1 |
| 4,962,086 | 10/1990 | Gallagher et al. | 505/1 |
| 4,980,339 | 12/1990 | Setsune et al. | 505/1 |
| 5,001,108 | 3/1991 | Taguchi | 505/1 |
| 5,024,894 | 6/1991 | Chien | 428/433 |
| 5,028,583 | 7/1991 | Tanaka et al. | 505/1 |
| 5,047,385 | 9/1991 | Beasley et al. | 505/1 |
| 5,049,543 | 9/1991 | Van Der Kolk et al. | 505/1 |
| 5,108,983 | 4/1992 | Lackey | 505/1 |

FOREIGN PATENT DOCUMENTS

2-239102  9/1990  Japan .

OTHER PUBLICATIONS

Zhang, Appl. Phys. Lett. 54(4), 23 Jan. 1989, pp. 380–382.
Lackey, Appl. Phys Lett. 56(12) 19 Mar. 1990, pp. 1175–1177.
Singh, J. Vac Sci. Technol. A, vol. 9, No. 3, May/Jun. 1991, p. 401.
Feng, Appl. Phys. Lett. 59(10), 2 Sep. 1991 pp. 1248–1250.
Aoki, Jpn. J. Appl. Phys. vol. 31 (1992) pp. L547–L549, part 2, No. 5A.
Kim, Thin Solid Films, 214 (1992) 229–234.
"YBa2Cu3Oy Superconducting Thin Film Obtained by Laser Annealing", by Aizaki et al., Japanese Journal of Applied Physics, vol. 27, No. 2, Feb., 1988, pp. L231–L233.
"Epitaxial Y-Ba-Cu-O films on Si with Intermediate Layer by rf Magnetron Sputtering", but Miura et al., Applied Physics Letters, 53 (20), Nov. 14, 1988, pp. 1967–1969.
"Electropolishing" by John F. Jumer, Metal Finishing, 43rd Annual Edition Guidebook Directory, 1975, pp. 456–466.

*Primary Examiner*—Richard Bueker
*Attorney, Agent, or Firm*—Paul R. Webb, II

[57] ABSTRACT

This invention relates to strontium titanate, hereinafter referred to as SrTiO3, films of the type produced by chemical vapor deposition (CVD) that are oriented so that the film's (100) face is parallel to the surface plane of the substrate. Such structures of this type, generally allow the SrTiO3 film to be deposited such that a high density capacitor or a buffer layer for a superconductor can be created.

14 Claims, 6 Drawing Sheets

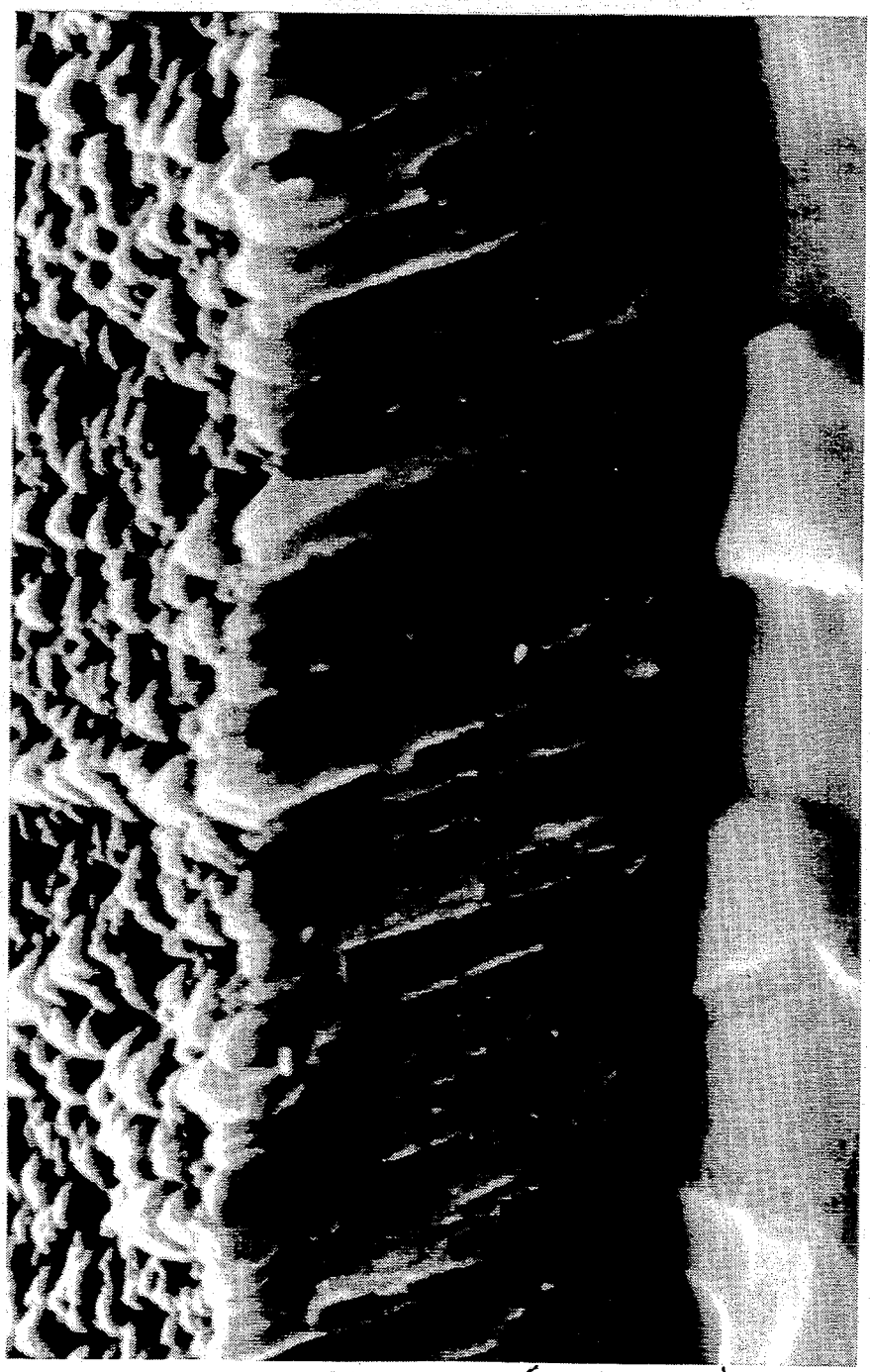

APPARATUS AND METHOD FOR MAKING ALIGNED HI-TC TAPE SUPERCONDUCTORS

BACKGROUND OF THE INVENTION

1. Field of the Invention

This invention relates to strontium titanate, hereinafter referred to as $SrTiO_3$, films of the type produced by chemical vapor deposition (CVD) that are oriented so that the film's (100) face is parallel to the surface plane of the substrate. Such structures of this type, generally allow the $SrTiO_3$ film to be deposited such that a high density capacitor or a buffer layer for a superconductor can be created.

2. Description of Related Art

There is a practical limitation of high transition temperature superconducting materials, hereinafter referred to as Hi-Tc materials, or the temperature at which the material becomes superconductive, especially, in the use of ceramics in a superconductor. Modified perovskites exhibit excellent superconductive properties but are brittle and cannot sustain any tensile strains. Such tensile strains develop, for example, when the superconductor is wrapped around a bobbin to form a superconductive winding for a magnet. It would then be desirable to mount the Hi-Tc material on a metal backing, forming a composite, which could withstand the tensile strains, then in applications such as superconductive windings, the conductor could be wound while keeping the Hi-Tc ceramic material on the neutral axis which should be practically strain free. Alternatively, the composite could be fabricated and wound in such a way as to put the Hi-Tc ceramic into slight compression.

Prior to the present invention, it was known in the production of substrates for superconductors to employ the use of a single crystal of a perovskite material such as $SrTiO_3$. Such single crystals may even attain the size of up to 4" in diameter. See for example, U.S. Pat. No. 4,916,114 to Eckbardt Hoeing, entitled "Method for Producing a Layer-Like Composition of Oxide-Ceramic Superconducting Material". However, such single crystal substrates are impractical when being applied to superconductive windings because the single crystal can neither be grown long enough nor continuously wound on bobbins to fabricate magnets. Also, single crystals cannot be strung together conveniently to form an electrically continuous winding.

In another area concerning the production of buffer layers on a superconductive winding, a thin film of barium fluoride ($BaF_2$) was used as a buffer layer between the metal substrate and the superconducting film. While the $BaF_2$ buffer improved the superconducting properties of a $YBa_2Cu_3O_{7-x}$ superconductor, hereinafter referred to as YBCO, the superconducting properties of the YBCO could be further improved if the buffer layer was constructed of a material, preferably, a perovskite, which is more compatible with the YBCO, which can be classified as a modified perovskite.

Finally, no attempts have been made to employ a CVD process for depositing material on a substrate which material can act as both a buffer layer for a superconductor and a high density capacitor. Further, the use of a CVD process to deposit material which is more compatible with the superconductor and can be deposited to form relatively pure buffer layers for the superconductor and high density capacitors would be still more advantageous.

It is apparent from above that there exists a need in the art for a material that can be deposited by a CVD process and also increases the superconductivity of the superconductive winding, and which can at least be deposited at the same deposition rates as known materials deposited by a CVD process, but which at the same time can create either a buffer layer for the superconductor or a high density capacitor. It is a purpose of this invention to fulfill this and other needs in the art in a manner more apparent to the skilled artisan once given the following disclosure.

SUMMARY OF THE INVENTION

Generally speaking, this invention fulfills these needs by providing an apparatus for making an aligned Hi-Tc tape superconductor buffer layer, comprising a cleaning and polishing means; a chemical vapor deposition means operatively connected to said cleaning and polishing means for depositing a strontium titanate material; a cooling means operatively connected to said deposition means; and a laser treatment means operatively connected to said cooling means wherein a tape substrate contacts said cleaning and polishing means to clean and polish said substrate, said tape substrate then contacts said deposition means such that a strontium titanate layer is deposited on said substrate, said tape substrate then contacts said cooling means such that said substrate and said strontium titanate layer are substantially cooled in said cooling means, and said laser treatment means impinges on said deposited layer to create an aligned Hi-Tc tape superconductor buffer layer. Further, a superconductor is formed by depositing a superconductor material on the buffer layer.

In certain preferred embodiments the substrate is a metal such as molybdenum, stainless steel or copper and the deposited film material is made of $SrTiO_3$. Those practiced in the art will recognize that the principles can be used with other film materials such as potassium tantalate ($KTaO_3$) although the individual steps may be modified. The cleaning and polishing means include a degreasing vat, an electropolishing station and several ultrasonic cleaning stations. The laser treatment means includes a $CO_2$ laser. If it is desired to produce a high density capacitor, the steps of impinging the $CO_2$ laser beam on the buffer layer and depositing a superconductor material on said layer are omitted.

In another further preferred embodiment, the $SrTiO_3$ is deposited on the substrate by the CVD process such that the (100) face of the $SrTiO_3$ molecules are parallel to the surface plane of the substrate which assists in properly orienting the c-axis of the superconductor which is later deposited on top of the buffer layer and, additionally, properly aligns the deposited $SrTiO_3$ molecules to create a high density capacitor.

The preferred aligned Hi-Tc Tape superconductor buffer layer according to this invention, offers the following advantages: improved hospitality to superconducting perovskite on the buffer layer; good capacitance characteristics of the capacitor; excellent economy; good safety characteristics; excellent versatility; and ease of operation. In fact, in many of the preferred embodiments, these factors of improved hospitality to superconducting properties, economy, and versatility are optimized to an extent considerably higher than heretofore achieved in prior, known buffer layers.

BRIEF DESCRIPTION OF THE DRAWINGS

The above and other features of the present invention which will become more apparent as the description proceeds are best understood by considering the following detailed description in conjunction with the accompanying drawings wherein like numbers represent like parts through several views and in which:

FIG. 6 is a photographic presentation of the $SrTiO_3$ layer after being deposited on the substrate.

DETAILED DESCRIPTION OF THE INVENTION

Figure 1:
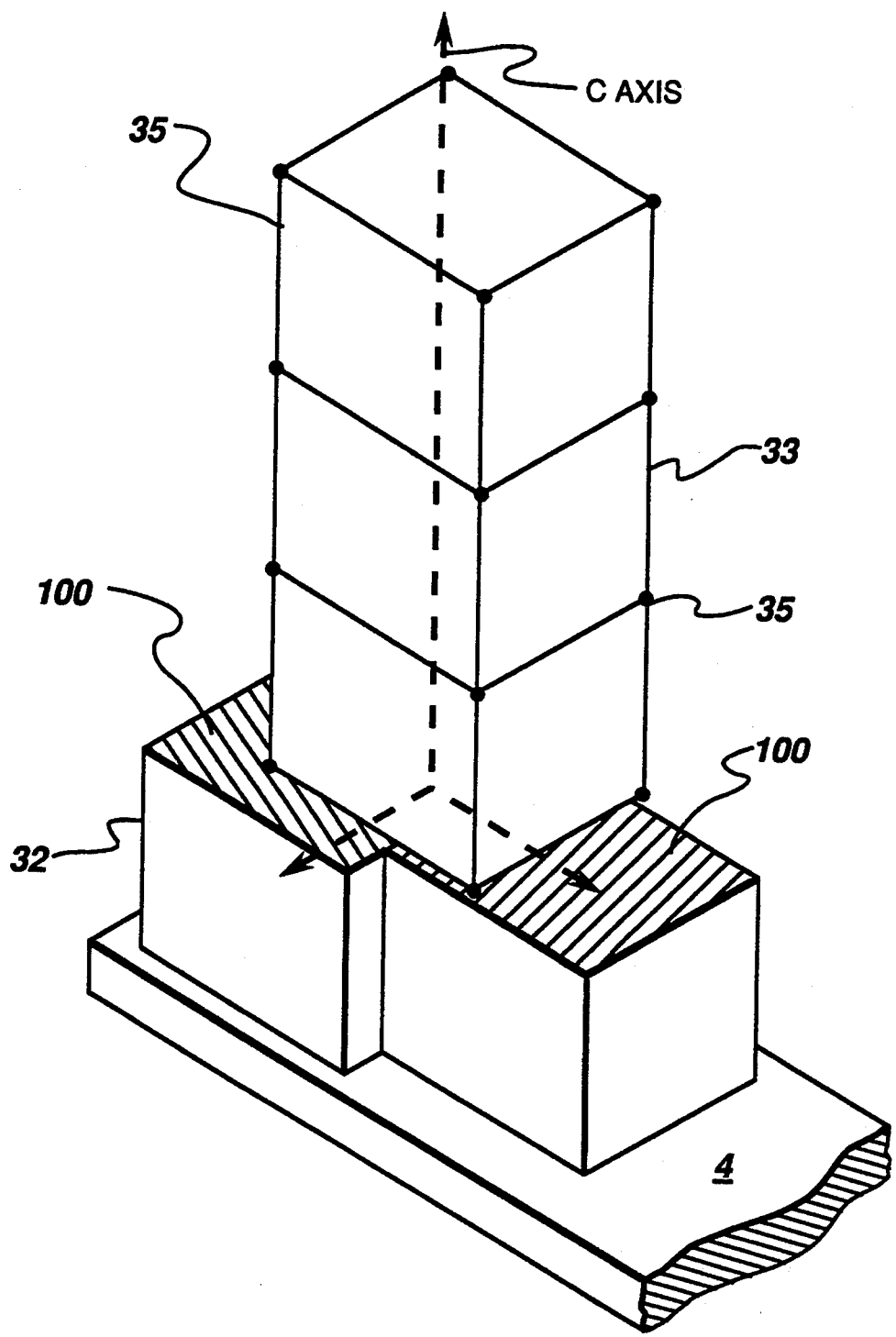
FIG. 1 is a schematic drawing of a deposited buffer layer with the (100) face parallel to the surface plane of the substrate and the superconductor with its c-axis normal to the surface of the substrate deposited on top.

With reference first to FIG. 1, there is illustrated a schematic drawing of a buffer layer of $SrTiO_3$ 32 after being deposited upon a substrate 4 with a layer 33 of any suitable high temperature ceramic oxide superconductor material deposited on top of the buffer layer 32. High temperature ceramic oxide superconductors suitable for use in the practice of this invention include the yttrium-barium compounds often referred to as YBCO or 1-2-3 system, the thallium system (TBCCO) and the bismuth system (BSCCO). These systems can be ramified by inclusion of one or more substitutional elements such as lead, silver, strontium, potassium and the like. The orientation of the (100) face with respect to the substrate surface can be discerned, in that, the (100) face of the buffer is parallel to the plane of the substrate surface upon which the buffer layer 32 is located. The (100) face becomes oriented in this manner due to the inherent nature of the molecular structure of the $SrTiO_3$ as it is deposited on the surface of substrate 4 during the chemical vapor deposition (CVD) process.

With respect to the superconductor 33, the c-axis of the superconductor is oriented upwardly from the surface of substrate 4. The c-axis is positioned upwardly due to the inherent nature of the superconductor 33 as it is deposited on the hospitable buffer layer 32. It is important to recognize that in order for the superconductor 33 to properly conduct electricity, the planes 35 of copper (Cu) atoms contained within the adjacent superconductor crystal lattice structures must line up along the length of the superconductor layer 33. The proper alignment of the (100) face of the $SrTiO_3$ provides a buffer layer which allows the superconductor 33 to be deposited upon the buffer layer 32 such that the planes 35 of Cu atoms are aligned. In order to even further increase the precision of the alignment of the planes 35 of Cu atoms prior to deposition of the superconductor 33, the buffer layer 32 is treated with a localized heat source, for example, a laser beam of a $CO_2$ laser (FIG. 4) which more precisely orients the (100) face of the buffer layer 32. However, if it is desired to only create a high capacitance capacitor, then the deposition of the superconductor is omitted and the laser treatment can become optional depending on the performance of the capacitor sought. A more specific discussion of the capacitor and laser treatment of the buffer layer 32 are described below.

Finally, regarding the high temperature ceramic oxide superconductor, the superconductor can be classified as a modified perovskite while $SrTiO_3$ is materially classified as a perovskite. Thus, when the superconductor is deposited upon the $SrTiO_3$, the interface between the two compounds remains relatively stable which keeps the planes 35 of Cu atoms of the superconductor in proper alignment along the length of the superconductor.

Figure 2:
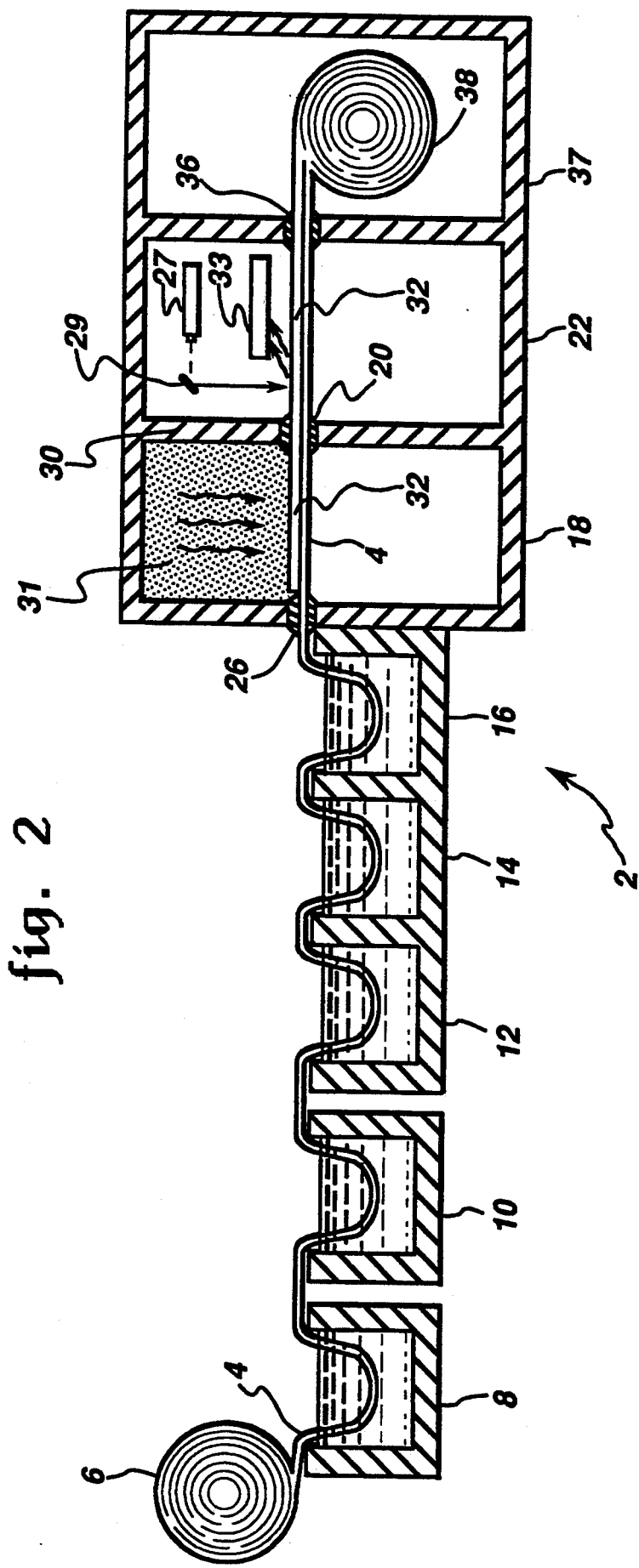
FIG. 2 is a schematic drawing of a chemical vapor deposition (CVD) process along with stations for laser treating the deposited film and cooling it, according to the present invention.

With respect to FIG. 2, CVD apparatus 2 for depositing $SrTiO_3$ on a substrate 4 is shown. Tape substrate 4 is, preferably, any suitable metallic substrate, such as stainless steel or molybdenum and is initially wound on coil 6. In order to clean substrate 4, coil 6 is unwound and substrate 4 is conventionally degreased by any suitable Freon ® solvent in degreasing vat 8. Substrate 4 is then passed through an electropolishing station 10 where substrate 4 is electropolished by materials appropriate for the particular metal substrate such that, preferably, there are no scratches greater than 45Å in substrate 4. Next, substrate 4 is subjected to ultrasonic cleaning station 12 Where substrate 4 is ultrasonically cleaned by, preferably, de-ionized water. The ultrasonic cleaning in station 12 is followed by another ultrasonic cleaning station 14 where substrate 4 is further ultrasonically cleaned by, preferably, acetone. The ultrasonic cleaning in station 14, preferably, is carried out for approximately 20 minutes. Finally, substrate 4 passes through another ultrasonic cleaning station 16, where substrate 4 is ultrasonically cleaned by, preferably, methanol, for approximately 10 minutes.

Figure 3:
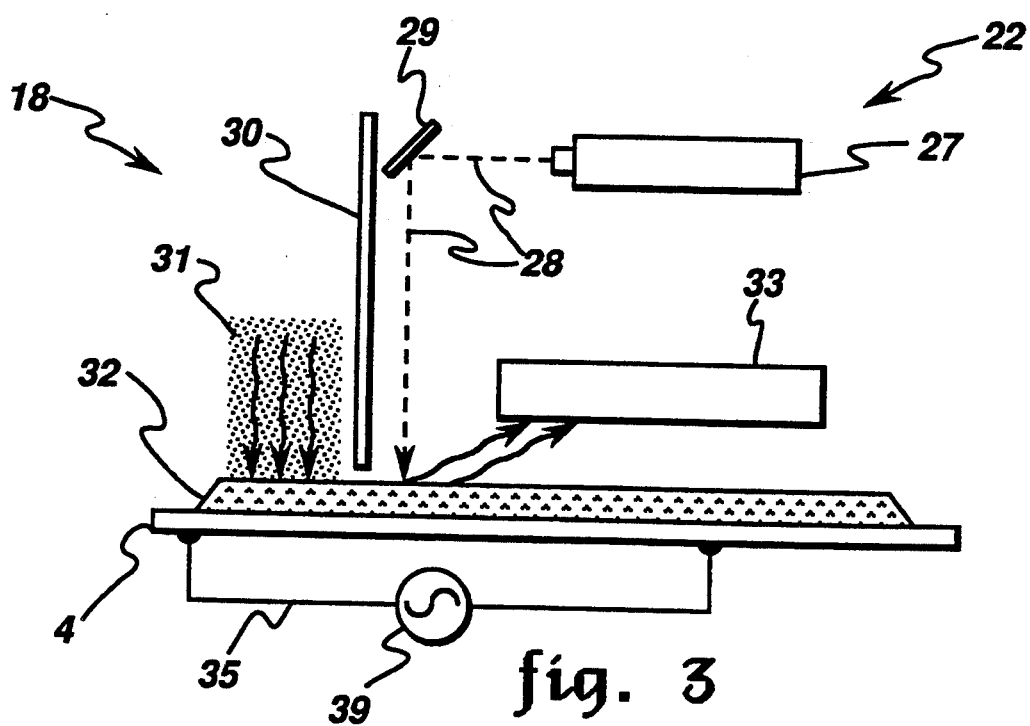
FIG. 3 is a detailed drawing, of the substrate being coated in the CVD chamber and being laser treated subsequent to depositing the film.

With respect to FIGS. 2 and 3, after substrate 4 has been cleaned, substrate 4 passes through a conventional vacuum seal 26 into CVD chamber 18. In chamber 18, gases, preferably, oxygen enriched gases, such as Argon enriched with oxygen, are introduced into chamber 18 by a conventional gas transporting apparatus (not shown). Material 31 is deposited on substrate 4 by conventional CVD techniques to form deposited layer 32. Layer 32 and material 31, preferably, are constructed of strontium titanate ($SrTiO_3$). It is to be understood that substrate 4 may be heated by a conventional power source 34 which is operatively connected to substrate 4 by conventional leads 35.

After layer 32 is deposited on substrate 4, layer 32 passes through a conventional vacuum seal 20 into laser treatment chamber 22. A laser beam 28 from a conventional high power $CO_2$ laser source 27, is reflected off of a conventional mirror 29 and impinged on deposited layer 32. A conventional radiation and pressure shield 30 is located between laser source 27 and a wall of chamber 22 in order to prevent contamination of material 31. After layer 32 is impinged by laser beam 28, layer 32 is initially cooled by a conventional radiant cooler 33. Finally, substrate 4 with deposit layer 32 moves past a conventional high vacuum seal 36 and into a conventional evacuated cooling chamber 37 where substrate 4 is cooled in chamber 37 for approximately 5 hours.

After substrate 4 is cooled, it is rolled by conventional rolling techniques into roll 38. The resulting deposited 32 film is polycrystalline. If the film 32 is thick enough, roughly more than one (1) micron thick, the morphology of the upper parts of film 32, regardless of the structure near substrate 4, is columner with the (100) face parallel to the plane of the surface of substrate 4. In other words, $SrTiO_3$ films of sufficient thickness, on metallic substrates, have a strong preference to grow with the (100) face parallel to the plane of the substrate. This tendency, of columner grains of crystals stacked with the (100) faces oriented parallel to the flat face of the substrate 4, is preferred over any other orientation after deposition on the substrate surface. These results are illustrated in FIG. 6 which shows a representative film of $SrTiO_3$ deposited on a molybdenum substrate.

It is to be understood that the process for creating deposit layer 32 on substrate 4 can be adapted for batch production with a few minor changes. In particular, substrate 4 would have to be cut into pieces of a suitable length and width. Also, the pieces would have to be placed step by step into each of the chambers 8, 10, 12, 14, 16, 18 and 37. Finally, vacuum seals 26 and 36 may not be necessary because there is no need to insure the vacuum and integrity of chamber 18.

Figure 4:
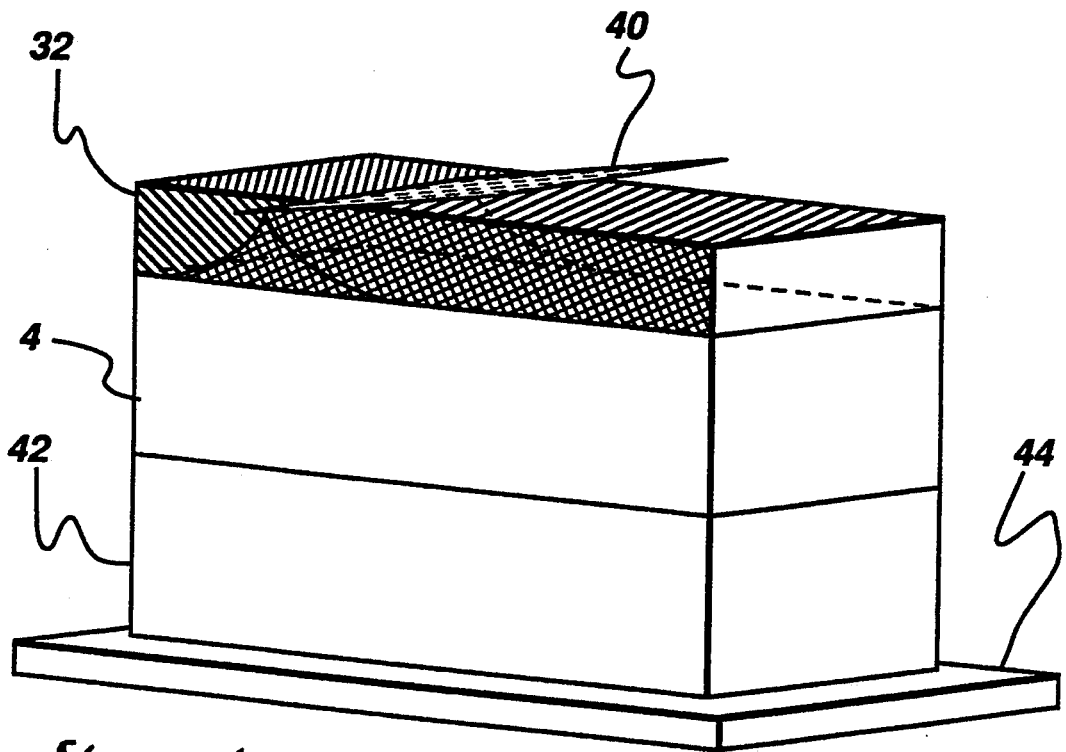
FIG. 4 is a schematic drawing of the laser treatment of the buffer layer, according to the present invention.

With respect to FIG. 4, when it is desired to create a buffer layer from deposited layer 32, deposited layer 32 must be impinged by, preferably, a laser beam 40 from a conventional 1000W $CO_2$ laser (not shown). In particular, substrate 4 with deposited layer 32 is mounted on a conventional heater block 42 which, in turn, is mounted on a conventional X-Y traverse 44. Laser beam 40 is then impinged upon layer 32 at a wavelength, preferably, of about 10mm so that the (100) faces of all of the $SiTiO_3$ molecules in the layer 32 are more precisely oriented with respect to substrate 4 such that the (100) faces are fairly precisely parallel to the plane of the surface of substrate 4 upon which layer 32 is deposited. This laser treatment further increases the precision of the orientation of the (100) faces of layer 32. It is to be understood that the laser treatment by laser beam 40 may be used in connection with the superconducting layer 33 (FIG. 1) in order to more properly align layer 33.

Figure 5A:
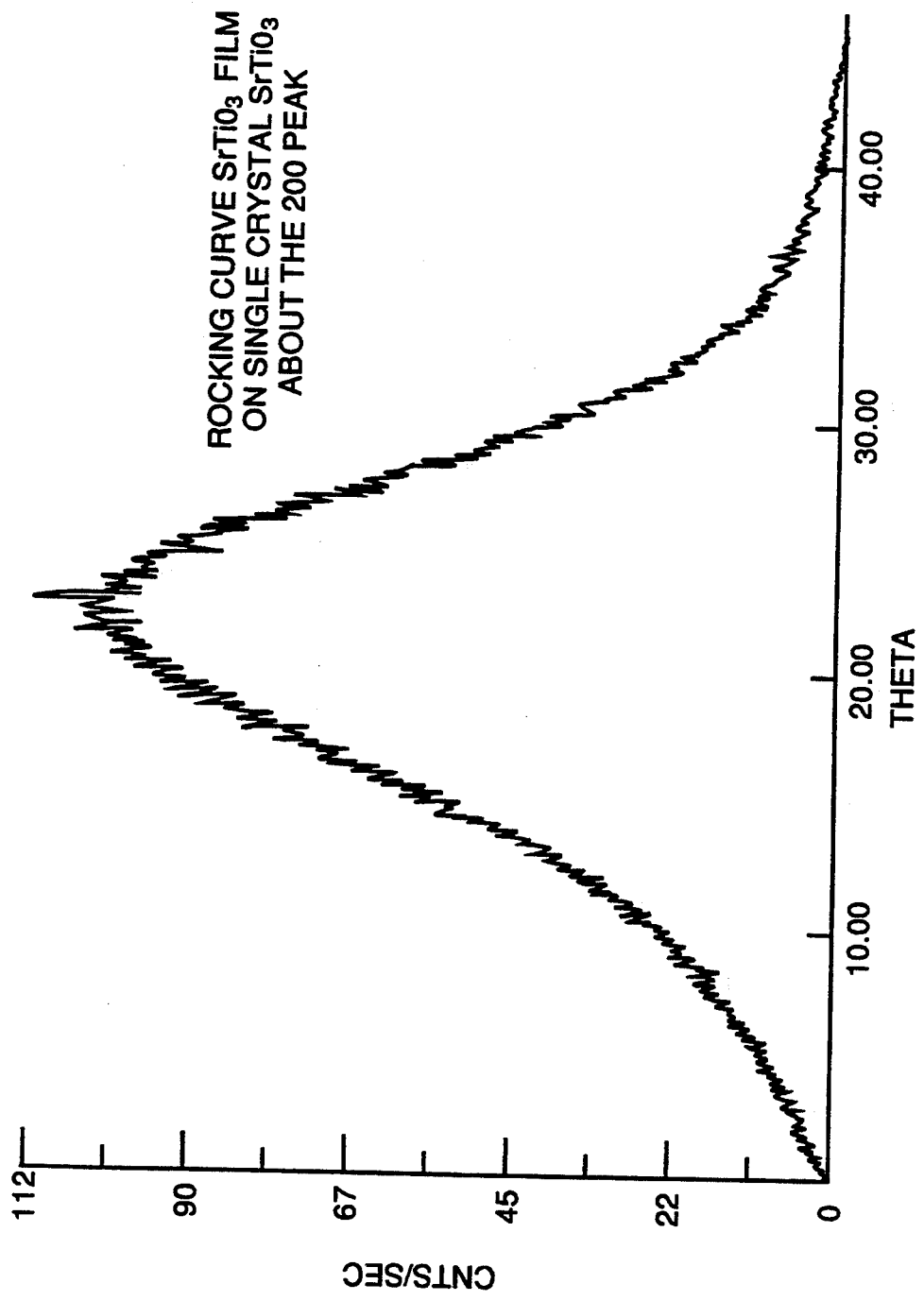
FIGS. 5a and 5b are graphical representations of the (100) orientation of the of the $SrTiO_3$ deposited layer prior to and after laser treatment, respectively.

FIG. 5a shows a standard rocking curve for a $SrTiO_3$ film about the (200) peak. The rocking curve was measured around the strong peak of (200). However, the (100) behavior is essentially the same. As can be seen, prior to laser treatment, a majority of the $SrTiO_3$ deposit has a lattice structure whose angular orientation (theta) with respect to the substrate surface is distributed with a peak around 22°. Consequently, when the superconductor is deposited on layer 32, the randomness of the orientation of the (100) faces of the $SiTiO_3$ layer may create a lack of alignment of the c-axis in the superconductor layer which can, ultimately, affect the superconductive properties of the superconductor layer.

Figure 5B:
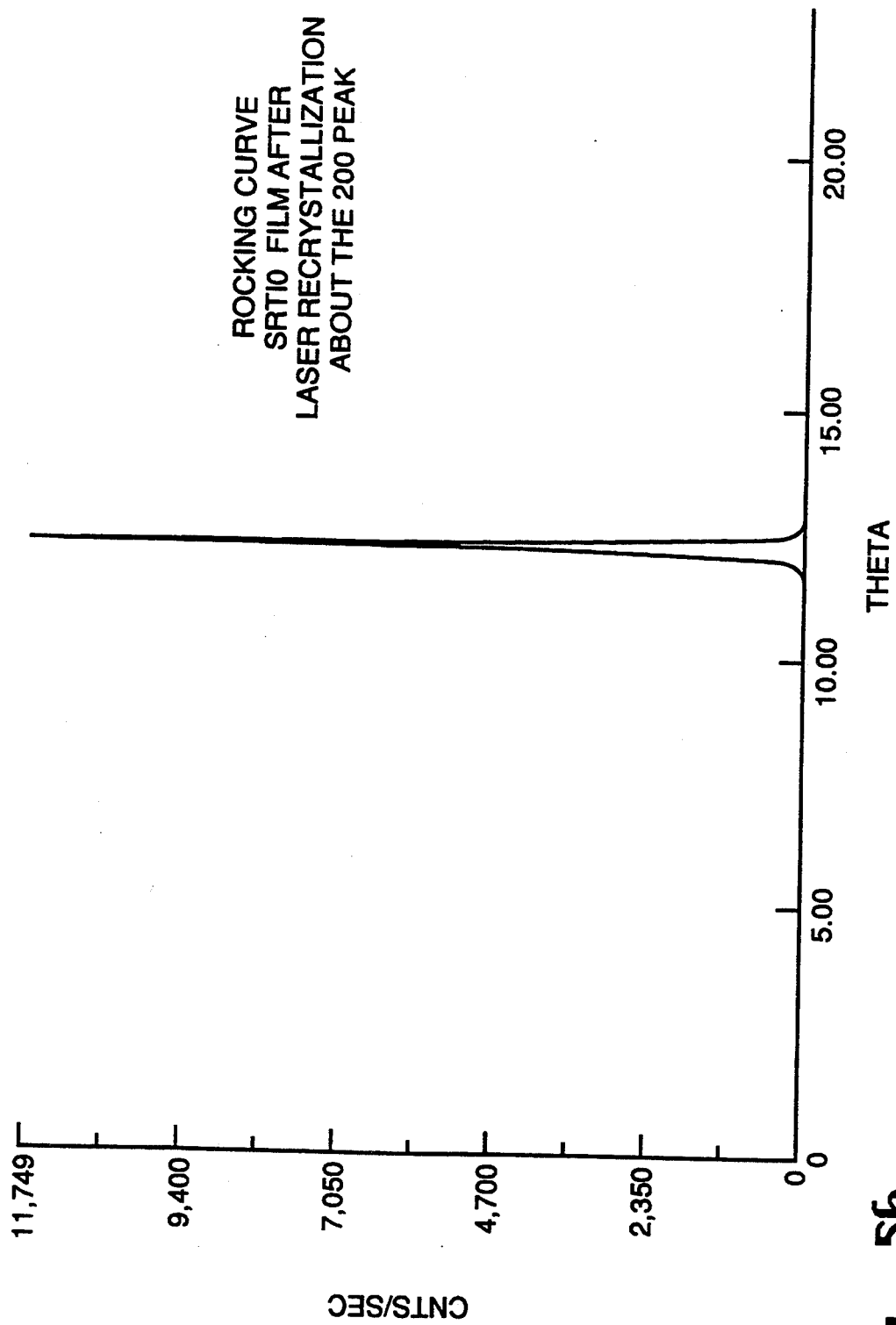

FIG. 5b shows that once once layer is recrystallized by localized transient laser heating, the lack of uniformity of the orientation of the (100) faces virtually disappears. It so happened that the measurement after recrystallization was carried around the (100) peak, but the behavior of the (200) peak is the same. In particular, FIG. 5b shows that after recrystallization, the rocking curve about the (100) peak of almost all of the $SiTiO_3$ film is concentrated around 12° with a very narrow spread therefrom. In production of the recrystallized film as shown in FIG. 5b, a preferred localized heat source is used which consists of a $CO_2$ laser with output at 10.6 min. The $CO_2$ laser is advantageous because it provides an intense controllable pattern that is strongly absorbed by $SrTiO_3$. Consequently, this improvement in orientation allows the superconductor molecules in superconductor layers to fairly accurately align along the length of the superconductor layer and increase the superconductive properties of the superconductor layer.

On the other hand, in order to produce a high density capacitor, layer 32 need not be laser treated. The capacitance properties of layer 32 as originally manufactured prior to laser treatment are sufficient to create a high density capacitor. In fact, the dielectric constant parallel to the axis normal to the (100) face (for simplicity we refer to this as the c-axis) of a $SiTiO_3$ molecule (190 at 26 degrees K. and 100 KHz)is approximately twice the value along either of the other axes (85 for the same conditions imposed on the c-axis).

One of the unique features of this invention is that molecular structure the $SrTiO_3$ is such that the $SrTiO_3$ is also capable of being initially laser treated with laser ablation to create a buffer layer or a high density capacitor and subsequently laser treated with the $CO_2$ laser to further create a highly conductive superconductor substrate. This is because the $SrTiO_3$ has a strong absorption rate at the wavelength where the excimer and $CO_2$ lasers operate, which are approximately 0.2 mm and 10.6mm, respectively.

Once given the above disclosure, many other features, modifications and improvements will become apparent to the skilled artisan including the use alternative perovskites such as $KTaO_3$. Such features, modifications and improvements are, therefore, considered to be a part of this invention, the scope of which is to be determined by the following claims.

What is claimed is:

1. An apparatus for making an aligned Hi-Tc tape superconductor buffer layer wherein said apparatus is comprised of:

a cleaning and polishing means;

a chemical vapor deposition means operatively connected to said cleaning and polishing means for depositing a polycrystalline strontium titanate material;

a cooling means operatively connected to said deposition means; and a laser treatment means operatively connected to said cooling means wherein a superconductor tape substrate contacts said cleaning and polishing means to clean and polish said substrate, said tape substrate then contacts said deposition means such that a strontium titanate layer is deposited on said substrate, said tape substrate then contacts said cooling means such that said substrate and said stronium titanate layer are substantially cooled in said cooling means, and said laser means impinges on said deposit layer to create an aligned Hi-Tc tape superconductor buffer layer.

2. The apparatus, as in claim 1, wherein said cleaning and polishing means are further comprised of:

a degreasing means;

an electropolishing means; and at least three ultrasonic cleaning means.

3. The apparatus, as in claim 2, wherein said degreasing means is further comprised of:

a degreasing vat having solvent substantially contained within said vat.

4. The apparatus, as in claim 2, wherein said electropolishing means removes scratches of greater than 45Å.

5. The apparatus, as in claim 2, wherein said ultrasonic cleaning means are further comprised of:
   a de-ionized water means;
   an acetone means; and
   a methanol means.

6. The apparatus, as in claim 1, wherein said cooling means is further comprised of:
   a radiant cooler means; and
   a cooling chamber means.

7. The apparatus, as in claim 1, wherein said laser treatment means is further comprised of:
   a laser beam from a $CO_2$ laser source which is impinged upon a portion of said strontium titanate layer such that a molecular face of said strontium titanate layer is oriented in a predetermined direction with respect to a surface of said substrate.

8. An apparatus for making an aligned Hi-Tc tape superconductor wherein said apparatus is comprised of:
   a cleaning and polishing means;
   a chemical vapor deposition means operatively connected to said cleaning and polishing means for depositing a polycrystalline strontium titanate material;
   a cooling means operatively connected to said deposition means;
   a laser treatment means operatively connected to said cooling means wherein a superconductor tape substrate contacts said cleaning and polishing means to clean and polish said substrate, said tape substrate then contacts said deposition means such that a strontium titanate layer is deposited on said substrate, said tape substrate then contacts said cooling means such that said substrate and said stronium titanate layer are substantially cooled in said cooling means, and said laser means impinges on said deposit layer to create an aligned Hi-Tc tape superconductor buffer layer; and
   a superconductor deposition means operatively connected to said laser treatment means for depositing a high temperature ceramic oxide superconductor material substantially on said laser-treated buffer layer.

9. The apparatus, as in claim 8, wherein said cleaning and polishing means are further comprised of:
   a degreasing means;
   an electropolishing means; and
   at least three ultrasonic cleaning means.

10. The apparatus, as in claim 9, wherein said degreasing means is further comprised of:
    a degreasing vat having solvent substantially contained within said vat.

11. The apparatus, as in claim 9, wherein said electropolishing means removes scratches of greater than 45Å.

12. The apparatus, as in claim 9, wherein said ultrasonic cleaning means are further comprised of:
    a de-ionized water means;
    an acetone means; and
    a methanol means.

13. The apparatus, as in claim 8, wherein said cooling means is further comprised of:
    a radiant cooler means; and
    a cooling chamber means.

14. The apparatus, as in claim 8, wherein said laser treatment means is further comprised of:
    a laser beam from a $CO_2$ laser source which is impinged upon a portion of said strontium titanate layer such that a molecular face of said strontium titanate layer is oriented in a predetermined direction with respect to a surface of said substrate.

* * * * *